United States Patent [19]
Kadomura

[11] Patent Number: 5,567,268
[45] Date of Patent: Oct. 22, 1996

[54] PLASMA PROCESSING APPARATUS AND METHOD FOR CARRYING OUT PLASMA PROCESSING BY USING SUCH PLASMA PROCESSING APPARATUS

[75] Inventor: Shingo Kadomura, Kanagawa, Japan

[73] Assignee: Sony Corporation, Tokyo, Japan

[21] Appl. No.: 374,822

[22] Filed: Jan. 19, 1995

[30] Foreign Application Priority Data

Jan. 31, 1994 [JP] Japan ................................. 6-027286

[51] Int. Cl.⁶ ................................. H01L 21/00
[52] U.S. Cl. ................. 156/345; 156/643.1; 216/70
[58] Field of Search .................... 156/643.1, 345 P; 216/67, 70; 204/298.37

[56] References Cited

U.S. PATENT DOCUMENTS 4,990,229  2/1991  Campbell et al. .
5,091,049  2/1992  Campbell et al. .
5,370,765  12/1994  Dandl .............................. 156/345 P X

*Primary Examiner*—William Powell
*Attorney, Agent, or Firm*—Hill, Steadman & Simpson

[57] ABSTRACT

A helicon wave plasma producing section is provided in the top area of process chamber, and ICP (Inductively Coupled Plasma) producing section is provided in the area on the downstream side thereof. Source power is supplied from a common plasma excitation RF power supply through control means to loop antenna in the former and multi-turn antenna in the latter. Thus, helicon wave plasma diffused from a bell-jar and inductively coupled plasma newly dissociated and produced by inductively coupled discharge are caused to coexist to carry out plasma processing, thereby making it possible to conduct control of ion/radical production ratio. Thus, higher accuracy plasma processing can be carried. Further, when applied to dry etching, ion assist mechanism is caused to effectively function to permit implementation of satisfactory high speed anisotropic processing as well.

11 Claims, 6 Drawing Sheets

PLASMA PROCESSING APPARATUS AND METHOD FOR CARRYING OUT PLASMA PROCESSING BY USING SUCH PLASMA PROCESSING APPARATUS

BACKGROUND OF THE INVENTION

1. Field of the Invention

This invention relates to a plasma processing apparatus applied in the field for manufacturing, e.g., a semiconductor device and a plasma processing method using such an apparatus, and more particularly to an apparatus capable of controlling production ratio between ions and radicals in so called high density plasma, and a method in which such an apparatus is used to carry out, with high accuracy, plasma processing represented by dry etching.

2. Description of the Related Art

With improvements in the degree of integration of semiconductor devices as represented by VLSI, and further ULSI, reduction of the minimum processing dimension thereof is being rapidly developed. For example, in 84M DRAM which will be mass-produced in the near future, design rule of 0.35 µm is adopted. Moreover, when viewed from the level of researches, aiming at manufacturing of the next generation and the further next generation semiconductor devices, studies on miniaturization processing based design rule of 0.25~0.1 µm are being developed.

Dry etching which discharges and dissociates etching gas within a high vacuum chamber to etch samples by making use of ions or radials in produced plasma is a technology which has greatly contributed to development of such miniaturization technology. In the present circumstances, ECR (Electron Cyclotron Resonance) system and magnetron RIE system are the main current of plasma production.

The ECR system allows electrons to undergo spiral (screw) movement under the electron cyclotron resonance condition based on interaction between magnetic field of $8.75 \times 10^{-2}$ T (875G) and microwave (2.45 GHz) to thereby increase the probability of collision between electrons and gas molecules, thereby permitting attainment of ion density of the order of $10^{11}/cm^3$ even under the condition of low gas pressure of 0.01~0.33 Pa ($10^{-3}$~$10^{-5}$ Torr). This system also has the great merit that wafer bias is used in combination so that plasma density and ion energy can be independently controlled.

On the other hand, the magnetron RIE system applies transverse magnetic field to electric field to thereby confine electrons within plasma to allow them to carry out cycloid movement in the vicinity of the wafer to elongate travel and life time to thereby improve ionization rate even under the condition of low gas pressure. In accordance with this system, it is possible to attain ion density of the order of $10^{10}/cm^3$.

However, when attempt is made to form, with good accuracy, fine pattern of the minimum processing dimension 0.25 µm required in 256M DRAM or dimension narrower than that, it is becoming clear that there is limitation in the case of existing plasma.

For example, in both the ECR system and the magnetron RIE system described above, strong magnetic field is used in order to improve plasma density. However, in recent processes in which large diameter wafer having diameter ranging up to 8 inches, it is difficult to allow such magnetic field to be uniform over the entire surface of the wafer. As a result, plasma density becomes uneven and breakdown of gate insulating film is apt to occur. Moreover, there occurs the problem that electrons stored in the wafer affects the incident direction of ions resulting from the fact that capture rates with respect to magnetic field of electrons and ions under strong magnetic field are different, giving rise to extraordinary etching shape.

This problem appears in a form of occurrence of side etch into W film 5 in etching of Al/W system stacked (laminated) wiring film as shown in FIG. 1, for example, in practice. This figure shows the state where as the result of the fact that Al/W system stacked wiring film is etched on $SiO_x$ interlayer insulating film 1, anisotropic shapes are obtained with respect to Ti film 2, TiN film 3 (which are referred to as barrier metal 4), Al-1% Si film 6 and TiON reflection protective film 7, but side etch takes place with respect to W film 5.

Under such fine design rule, essential anisotropic etching based on clean process which does not rely upon side wall protection is desired, but discharge under low gas pressure condition is required for this purpose. However, density of chemical species in plasma contributing to etching is lowered under low gas pressure condition as a matter of course, giving rise to the problems of low etching speed (etch rate) and low throughput.

While realization of lower gas pressure, higher plasma density, and lower magnetic field in the vicinity of wafer is required compared to the prior art, several kinds of new density plasma sources have been recently proposed in succession. As one of expected high density plasma sources, there is high density plasma source using helicon wave plasma described in, e.g., the Japanese Laid Open Patent No. 3-68773 (No. 68773/1991). In accordance with the production mechanism thereof, magnetic field is applied to cylindrical chamber to further apply high frequency to loop antenna wound on the chamber to produce helicon wave within the chamber to accelerate electrons by energy transportation from the helicon wave to electrons through the process of Landau attenuation to allow the accelerated electrons to impinge on gas molecules thus to obtain high ionization rate. In the case of helicon wave plasma, ion density of approximately $10^{11}$~$10^{13}/cm^3$ can be attained.

Since the above-described helicon wave plasma does not require strong magnetic field as used in the conventional ECR system or magnetron system for its production, magnetic field in the vicinity of the wafer can be reduced to much degree, or can become equal to substantially zero. Accordingly, unevenness of plasma density, vibration of ion and oblique incidence of ion, etc. due to the influence of magnetic field can be all reduced to much degree, and breakdown of gate insulating film or occurrence of extraordinary etching shape can be suppressed. In addition, since expensive magnetic coil and/or large-sized microwave source are not required, and relatively low frequency can be adopted as a frequency of high frequency power source used, the system can become compact, simplified and inexpensive. This is extremely great merit when the fact that the configuration of the device manufacturing system will be directed to multi-chamber configuration is taken into consideration.

However, since electron temperature is extremely high in plasma of low pressure and high density like helicon wave plasma, dissociation of gas molecules is excessively developed. As a result, the problem that ions are excessively produced, whereas quantity of radicals produced is insufficient would take place. Generally, high etch rate in dry etching is attained by so called ion assist mechanism to hasten chemical reaction by radicals adsorbed on the surface of sample by physical energy given in the form of ion impact. Accordingly, in the system where radicals are insufficient, adsorption of radicals and ion irradiation cannot be smoothly repeated. As a result, etch rate is disadvantageously lowered.

OBJECT AND SUMMARY OF THE INVENTION

With the above in view, an object of this invention is to provide a plasma processing apparatus capable of optimally controlling ion/radical production ratio even in the case where high density plasma is produced, and a plasma processing method in which such a plasma processing apparatus is used so that plasma processing such as dry etching, etc. can be carried out with high accuracy.

This invention has been proposed in order to attain the above-mentioned object.

Namely, a plasma processing apparatus of this invention comprises: a high vacuum vessel for containing a wafer; a helicon wave plasma producing section including a plasma production chamber circumferentially surrounded by a first high frequency antenna and magnetic field producing means and connected to the high vacuum vessel, and adapted for supplying helicon wave plasma into the high vacuum vessel; an ICP producing section including a second high frequency antenna which circumferentially surrounds the high vacuum vessel, and adapted for producing Inductively Coupled Plasma (ICP) within the high vacuum vessel; and control means for controlling operations of the helicon wave plasma producing section and the ICP producing section.

Here, it is extremely effective that the second high frequency antenna is symmetrically wound with the axial direction of magnetic field produced by the magnetic field producing means being as a center.

Moreover, it is preferable that auxiliary magnetic field producing means for converging divergence magnetic field in the vicinity of the position where the wafer is held is circumferentially provided outside the high vacuum vessel.

As auxiliary magnetic field produced in this case, mirror field or multiple field (multi-cusp field) can be exemplified.

The control means may include switch means for permitting simultaneous operation and/or time series operation of the first and second high frequency antennas.

Here, the simultaneous operation means that helicon wave plasma and ICP are simultaneously produced, and the time series operation means that both plasmas are alternately produced. Further, the simultaneous operation and the time series operation may be combined. For example, there may be carried out an operation to simultaneously produce helicon wave plasma and ICP to conduct plasma processing of a fixed time thereafter to further carry out plasma processing of a fixed time by using only either one of them.

It should be noted that frequencies of high frequency powers applied to the first and second high frequency antennas may be identical to each other, or different from each other. It is desirable that in the case where the same frequency is used, means including phase control means for allowing phases of high frequency powers respectively applied to the both antennas to be shifted to each other is adopted as the control means in order to prevent interference. At this time, phase difference which can most effectively prevent interference is ½ period.

Moreover, plasma processing method of this invention carries out a predetermined plasma processing with respect to wafer contained within high vacuum vessel of the above-described plasma processing apparatus. All plasma processing well known in the prior art such as dry etching, CVD and surface refining (reforming), etc. may be included in the above-mentioned plasma processing.

Further, it is possible to suitably carry out dry etching of the wafer as the plasma processing while controlling production ratio of chemical species within the vacuum vessel by operation of the switching means. The production ratio to be controlled is, e.g., production ratio between ions and radicals.

The feature of this invention resides in that both section for producing helicon wave plasma of high density plasma and section for producing ICP of high density plasma are provided in a single plasma processing apparatus to compensate, by ICP, radicals which are insufficient in the helicon plasma.

Mechanism for producing ICP is adapted, as already known, to deliver high frequency power to non-resonant multi-turn antenna (corresponding to the second high frequency antenna of this invention) wound around quartz cylinder serving as plasma producing chamber to rotate electrons in accordance with magnetic field formed inside the antenna to thereby allow electrons and gas molecules to impinge at a high probability. Since radical production rate by ICP is generally higher than that of helicon wave plasma, production mode of these both plasmas is suitably selected in such a manner that any one of simultaneous operation mode, alternate operation mode and only one mode is selected, thereby making it possible to provide an optimum ion/radical production ratio in dependency upon the content of process to be carried out with respect to sample wafer.

Accordingly, in the case where this apparatus is used for, e.g., dry etching, it is possible to smoothly ion assist mechanism. Thus, high speed anisotropic processing of fine pattern can be carried out.

In the plasma processing apparatus in which the helicon wave plasma producing section and the ICP producing section are provided in combination, axial direction of magnetic field produced by the means which produces magnetic field for producing helicon wave and that of magnetic field produced by the second high frequency antenna are caused to be in correspondence with each other, thereby making it possible to efficiently transport plasma within the high vacuum vessel, and to suppress consumption of chemical species by the inner wall of the high vacuum vessel by the plasma confinement effect by magnetic field that the second high frequency antenna produces.

As described above, in the plasma processing apparatus of this invention, while plasma confinement effect can be obtained to some extent also by the second high frequency antenna, auxiliary magnetic field producing means having the degree of freedom in design higher than that of the second high frequency antenna is further circumferentially provided outside high vacuum vessel to thereby easily converge divergence magnetic field in the vicinity of the position where wafer is held, thus permitting field strength in the vicinity of the surface of the wafer to become more uniform.

Selection of the above-described plasma production mode can be carried out as a simple current control by using switch means which controls operations of the first and second high frequency antennas. Here, in the case where frequencies of high frequency powers applied to the both antennas are the same, phase-control means is used to allow phases of both high frequency powers to be shifted to each other, thereby making it possible prevent interference so that stable plasma can be produced.

DETAILED DESCRIPTION OF THE PREFERRED EMBODIMENTS

Preferred embodiments in a practical sense of this invention will now be described in detail with reference to the attached drawings.

In the first embodiment of this invention, an example of the configuration of a dry etching apparatus will be described below.

Figure 1:
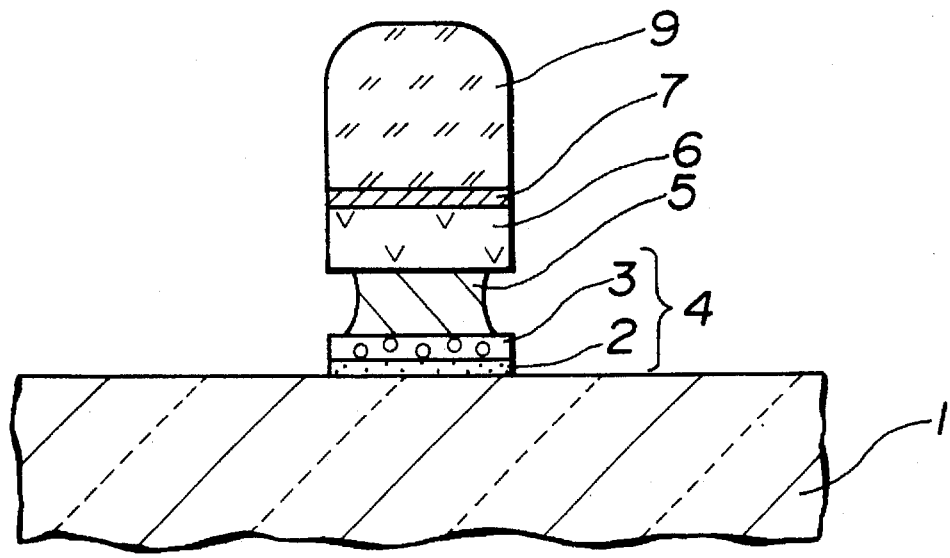
FIG. 1 is a cross sectional view showing, in a model form, the state where side etch takes place at W film in dry etching of Al/W system stacked wiring film of the related art.
Figure 2:
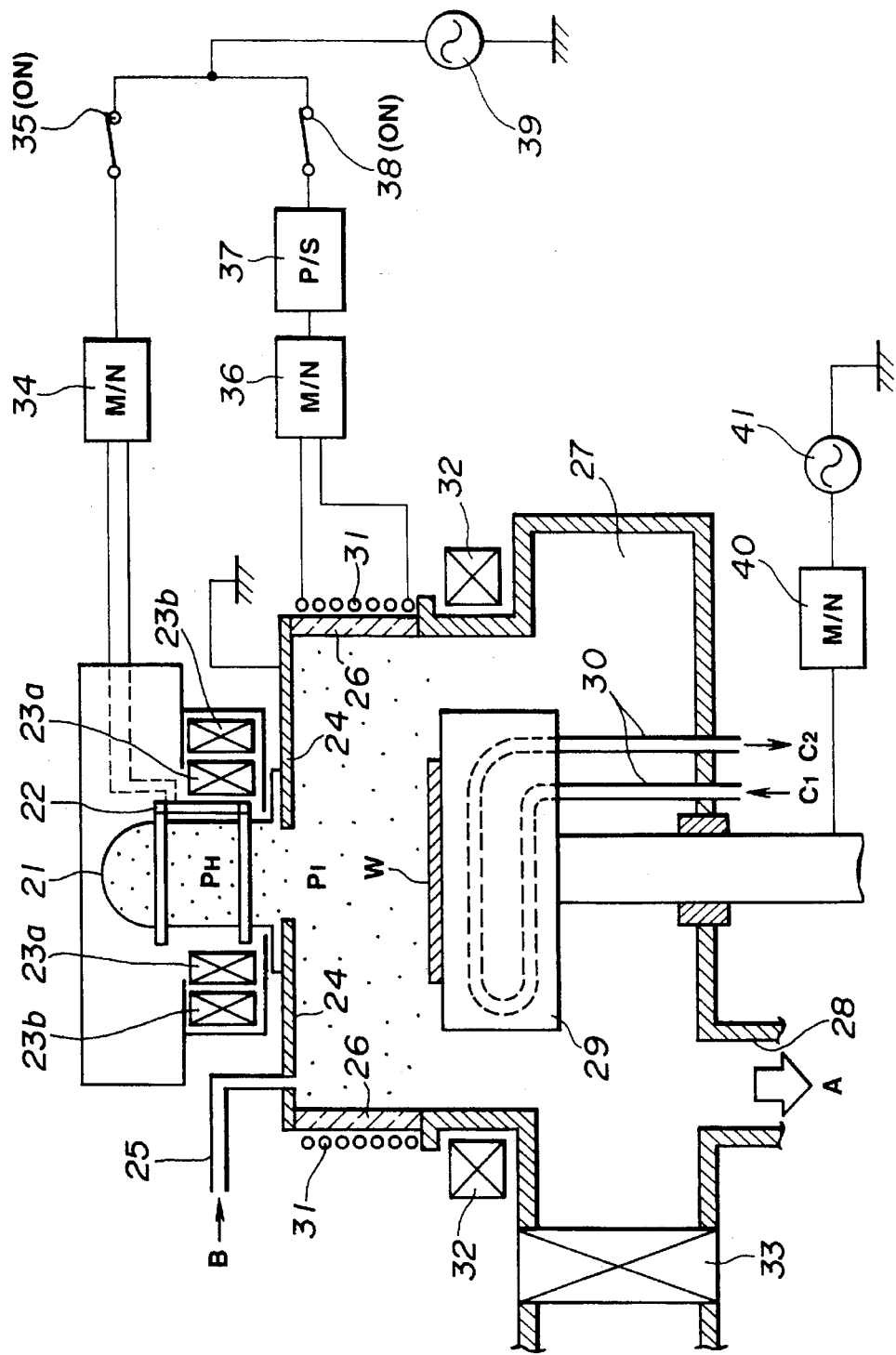
FIG. 2 is a schematic cross sectional view showing the state where helicon wave plasma and ICP are excited in a dry etching apparatus which is a first embodiment of this invention.

Conceptual configuration of this dry etching apparatus is shown in FIG. 2. This apparatus has a configuration in which a helicon wave plasma producing section is provided in the top area of process chamber serving as high vacuum vessel and an ICP producing section is provided in the area on the downstream side thereof, wherein source power is delivered through control means from a high frequency power supply common to these both producing sections.

The helicon wave plasma producing section comprises, therein, as main components, bell-jar 21 comprised of non-conductive material, which produces helicon wave plasma $P_H$; a loop antenna 22 having two loops which circumferentially turn around (surround) the bell-jar 21 and adapted for coupling RF power to plasma; an inner circumferential side solenoid coil 23a provided in a manner to circumferentially turn around (surround) the bell-jar 21 and adapted to produce magnetic field along the axial direction of the bell-jar 21 to mainly contribute to propagation of helicon wave; and an outer circumferential side solenoid coil 23b provided similarly to the solenoid coil 23a and mainly contributing to transportation of helicon wave plasma $P_H$.

In the embodiment, quartz was used as constituent material of the bell-jar 21.

RF power is applied to the loop antenna 22 through first switch 35 and first matching network (M/N) 34 for impedance matching from RF power supply 39 for plasma excitation. As a result, currents of which directions are opposite to each other flow in upper and lower two loops. In this embodiment, 13.56 MHz was used as frequency of the plasma excitation RF power supply 39. It should be noted that distance between both loops is optimized in dependency upon wave number of a desired helicon wave.

The bell-jar 21 is connected to process chamber 27 and is adapted so that helicon wave plasma $P_H$ is drawn into the process chamber 27 along divergence magnetic field formed by the inner circumferential side solenoid coil 23a and the outer circumferential solenoid coil 23b. The process chamber 27 is evacuated in direction indicated by arrow A through exhausting port 28 by exhausting system (not shown) so that the inside thereof is in high vacuum state. Moreover, this process chamber 27 is supplied with gas necessary for dry etching in direction indicated by arrow B from gas supply tube 25 opened to top board 24 at the upper part thereof, and is connected to, e.g., load lock chamber (not shown) through gate valve 33 at the side wall thereof. The wall surface of this process chamber 27 is constituted by using conductive material such as stainless steel, etc. except for a portion in axial direction which will be described later.

Within process chamber 27, conductive wafer stage 29 electrically isolated from the wall surface thereof is contained (accommodated). For example, wafer W is held thereon as a substrate to be processed so that a predetermined dry etching is implemented thereto. At the wafer stage 29, there is inserted cooling piping 30 supplied with coolant from chiller (not shown) in order to maintain wafer W being processed at a desired temperature to circulate this coolant in directions indicated by arrows $C_1$, $C_2$.

RF power supply 41 for application of bias which applies substrate bias to wafer W in order to control energy of ions incident from plasma is connected to the wafer stage 29 through third matching network (M/N) 40. In this embodiment, 2 MHz was used as frequency of bias application RF power supply 41. In this case, the top board 24 having conductive property functions as opposite earth electrode with respect to the substrate bias.

Further, in order to converge divergence magnetic field in the vicinity of the wafer stage 29, magnet 32 which can produce multi-cusp magnetic field is disposed as auxiliary magnetic field producing means outside the process chamber 27. It should be noted that the position where this magnet 32 is disposed is not limited to the illustrated position, but may be other portion, e.g., the portion around the support of wafer stage 29, etc. Further, such magnet may be replaced by solenoid coil for formation of mirror magnetic field.

The above-described configuration is similar to the configuration of the conventional helicon wave plasma etching apparatus. In this invention, ICP producing section for producing inductively coupled plasma $P_I$ is provided between the bell-jar 21 and wafer stage 29.

Namely, a portion in the axial direction of the conductive chamber wall of process chamber 27 is caused to be cylinder 26 comprised of non-conductive material, and multi-turn antenna 31 is wound on the outer circumferential side thereof. In this embodiment, quartz was used as constituent material of the cylinder 26. The number of turns of the multi-turn antenna 31 is optimized in dependency upon the condition such as diameter of cylinder 26, and/or RF frequency to be applied, etc.

The bell-jar 21, the cylinder 26, the multi-turn antenna 31 and wafer W, etc. are all disposed concentrically with the axis of process chamber 27. For this reason, magnetic field produced by the multi-turn antenna 31 exhibits the effect to efficiently draw helicon wave plasma $P_H$ diffused from the bell-jar 21 and confine it. Thus, this magnetic field permits uniform dry etching to be implemented to wafer W while suppressing consumption of chemical species by the chamber wall.

Source power is applied to the multi-turn antenna 31 through second switch 38, phase shifter (P/S) 37 and the second matching network (M/N) 36 from the previously described plasma excitation RF power supply 39. The phase shifter 37 shifts phases of high frequency powers applied to the loop antenna 22 and the multi-turn antenna 31 by, e.g., ½ period.

The dry etching apparatus thus constituted has a configuration quite simpler than that of the conventional dry etching apparatus based on the ECR system, and has smaller occupation area.

In such an apparatus, in order to simultaneously produce helicon wave plasma $P_H$ and inductively coupled plasma $P_I$, first switch 35 and second switch 38 are second switch 38 are both turned ON as shown in FIG. 2. At this time, helicon wave plasma $P_H$ diffused from bell-jar 21 and inductively coupled plasma $P_I$ produced as the result of the fact that gas introduced from gas supply tube 25 is newly dissociated by inductively coupled discharge coexist within process chamber 27. At this time, since phases of high frequency powers applied to loop antenna 22 and multi-turn antenna 31 are shifted to each other by ½ period, stable discharge could be continued.

Figure 3:
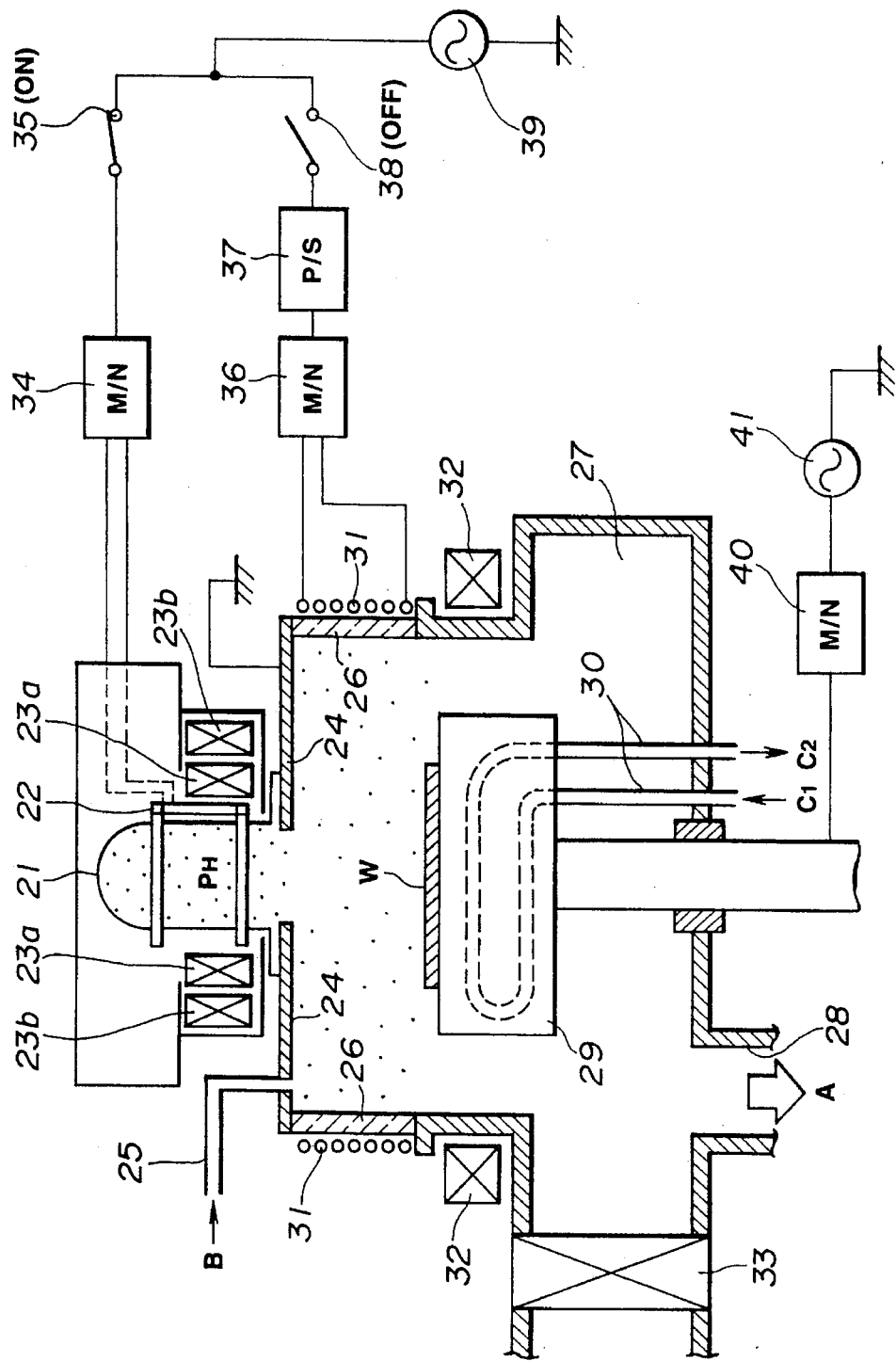
FIG. 3 is a schematic cross sectional view showing the state where only helicon wave plasma is excited in the dry etching apparatus which is the first embodiment of this invention.

On the other hand, in the case where it is desired to produce only helicon wave plasma $P_H$, first switch 35 is turned ON and second switch 38 is turned OFF as shown in FIG. 3. Thus, plasma existing within process chamber 27 results in only helicon wave plasma $P_H$ diffused from bell-jar 21.

It should be noted that although illustrative explanation is omitted, in the dry etching apparatus constituted as above, only inductively coupled plasma $P_I$ may be of course produced by allowing first switch 35 to be turned OFF and allowing second switch 38 to be turned ON.

In the second embodiment of this invention, etching of Al system wiring film was carried out by using the above-described dry etching apparatus. This process will now be described with reference to FIGS. 4A to 4C.

Figure 4A:
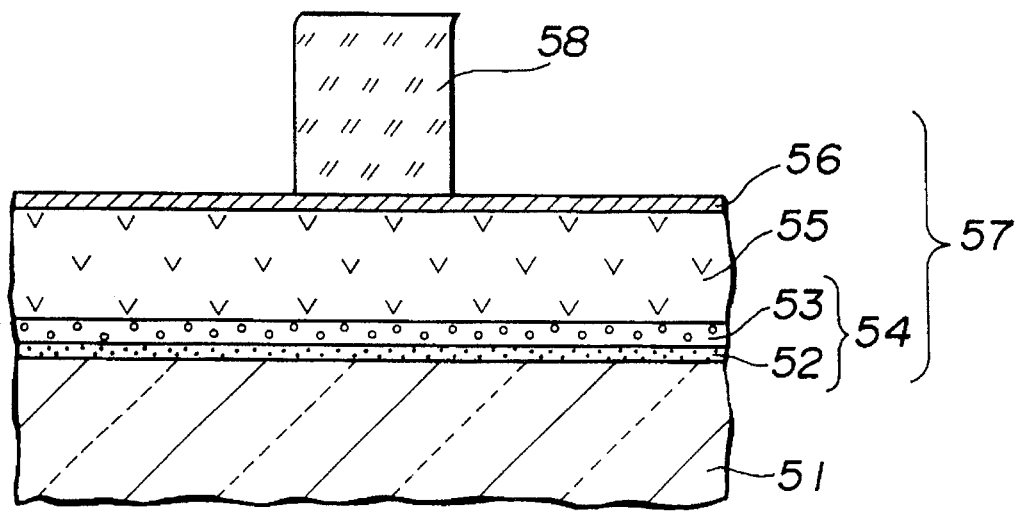
FIG. 4A is a cross sectional view showing, in a model form, the state of wafer which does not yet undergo etching in the process applied to dry etching of Al system wiring film which is a second embodiment of this invention.

The cross section of the essential part of wafer used as sample to be etched of this embodiment is shown in FIG. 4A. In this wafer, Al system wiring film 57 is formed on SiOx interlayer insulating film 51 and resist mask 58 of a predetermined pattern is further formed thereon. The Al system wiring film 57 is of a structure in which barrier metal 54 of Ti system, Al-1% Si film 55 and TiON reflection preventive film 56 are stacked in order recited. Further, the Ti system barrier metal 54 is, e.g., of a structure such that Ti film 52 and TiN film 53 are stacked in order from the lower layer side.

Moreover, the resist mask 58 is formed after undergoing KrF excimer laser lithograph using, e.g., chemical amplification system material so that pattern width is equal to, e.g., 0.25 μm.

This wafer was set on wafer stage 29 of the previously described dry etching apparatus to allow first and second switches 35 and 38 to be both turned on as shown in FIG. 2 to first carry out etching under the following condition by taking an example of TiON reflection prevention film 56 and Al-1% Si film 55.

| | |
|---|---|
| BCl 3 flow rate | 80 SCCM |
| Cl 2 flow rate | 120 SCCM |
| Gas pressure | 0.13 Pa |
| Source Power ($P_H$, $P_I$) | 2500 W (13.56 MHz) |
| RF bias power | 100 W (2 MHz) |
| Wafer Stage Temperature | 20° C. |

Figure 4B:
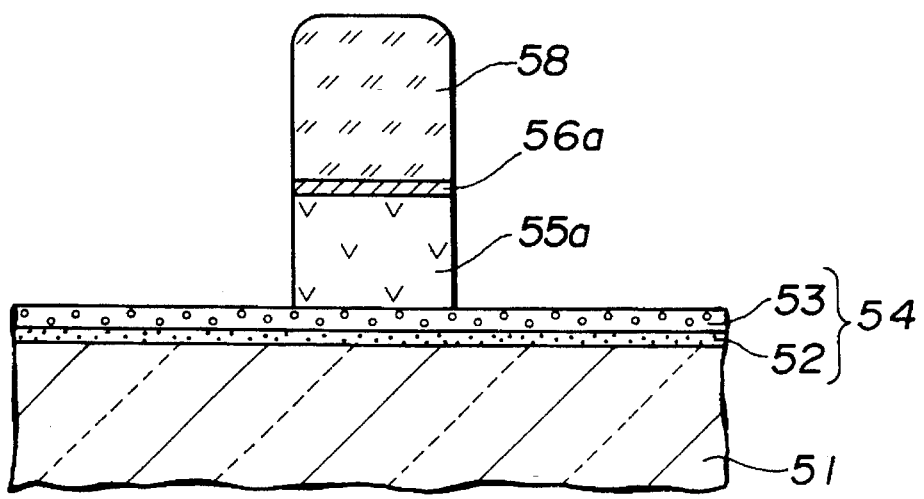
FIG. 4B a cross sectional view showing, in a model form, the state where TiON reflection preventive film and Al-1% Si film of FIG. 4A are etched.

The process which provides major process of etching is etching process of Al-1% Si film 55. Since etching of Al-1% Si film 55 is developed essentially in radical mode, Cl* (chlorine radical) abundantly existing in inductively coupled plasma $P_I$ and ions such as $BCl_x^+$, $Cl_x^+$ abundantly existing in helicon wave plasma $P_H$ are used here to develop efficient ion assist reaction. As a result, as shown in FIG. 4B, TiON reflection preventive film pattern 56a and Al-1% Si film pattern 55a having satisfactory anisotropic shape were obtained. It should be noted that, with respect to patterns having anisotropic shape of patterns of respective material film obtained after etching, notation is employed such that suffix a is attached to reference numerals of original material films (This similarly applies hereinafter).

Then, in order to etch the remaining barrier metal 54 by using only helicon wave plasma $P_H$, etching was continued under the same condition as above except that second switch 38 is turned OFF as shown in FIG. 3.

Figure 4C:
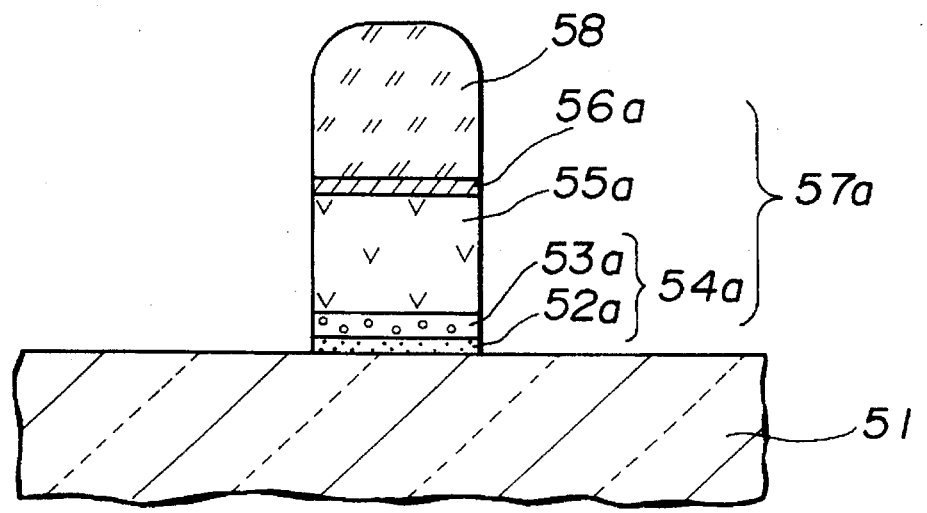
FIG. 4C is a cross sectional view showing, in a model form, the state where barrier metal is etched.

In this process, TiN film 55 and Ti film 54 primarily etched in a mode close to ion sputtering were rapidly etched by ions abundantly existing in helicon wave plasma $P_H$. As a result, ultimately, Al system wiring pattern 57a having satisfactory anisotropic shape was obtained as shown in FIG. 4C.

In the third embodiment, etching of Al/W system stacked wiring film was carried out by using the above-described dry etching apparatus. This process will be described with reference to FIGS. 5A to 5C.

Figure 5A:
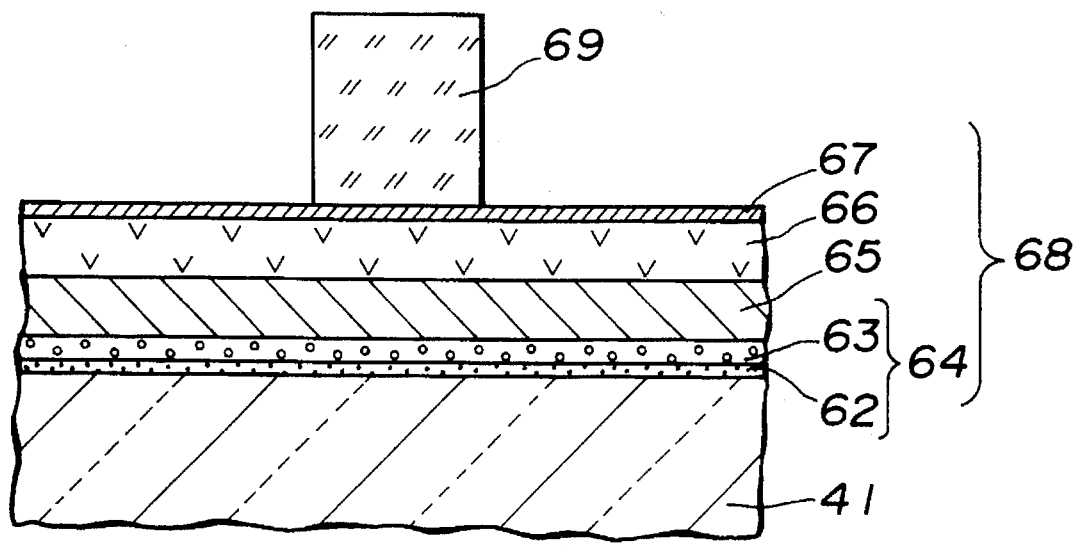
FIG. 5A is a cross sectional view showing, in a model form, the state of wafer which does not yet undergo etching in the process applied to dry etching of Al/W system stacked wiring film which is a third embodiment of this invention.

The cross section of the essential part of wafer used as etching sample of this embodiment is shown in FIG. 5A. In this wafer, Al/W system stacked wiring film 68 is formed on $SiO_X$ interlayer insulating film 61 and resist mask 69 of a predetermined pattern is further formed thereon. The Al/W system stacked wiring film 68 is of a structure in which Ti system barrier metal 64, W film 65, Al-1% Si film 66 and TiON reflection preventive film 67 are stacked in order recited, and the Ti system barrier metal 64 is, e.g., of a structure in which Ti film 62 and TiN film 63 are stacked in order from the lower layer side.

Moreover, the resist mask 69 is caused to undergo KrF excimer laser lithography using, e.g., chemical amplification system resist material so that pattern width is equal to, e.g., 0.25 μm.

This wafer was set on wafer stage 29 of the previously described dry etching apparatus to allow first and second switches 35 and 38 to be both turned ON as shown in FIG. 2 to etch TiON reflection preventive film 67 and Al-1% Si film 66 taken as an example under the following condition.

| | |
|---|---|
| BCl 3 flow rate | 80 SCCM |
| Cl 2 flow rate | 120 SCCM |
| Gas pressure | 0.13 Pa |
| Source Power ($P_H$, $P_I$) | 2500 W (13.56 MHz) |
| RF bias power | 100 W (2 MHz) |
| Wafer stage temperature | 20° C. |

Figure 5B:
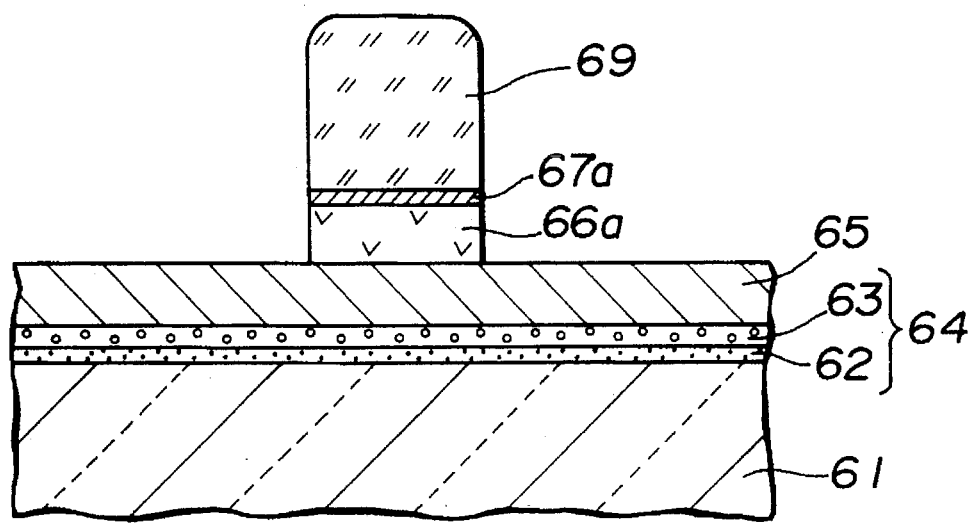
FIG. 5B is a cross sectional view showing, in a model form, the state where TiON reflection preventive film and Al-1% Si film of FIG. 5A are etched.

As a result, as shown in FIG. 5B, TiON reflection preventive pattern 67a and Al-1% Si film pattern 66a having satisfactory anisotropic shape were obtained.

Then, in order to etch the remaining W film 65 and barrier metal 64 by using only helicon wave plasma $P_H$, second switch 38 was turned OFF as shown in FIG. 3 to carry out etching under the following condition as an example.

| | |
|---|---|
| SF$_6$ flow rate | 30 SCCM |
| Cl$_2$ flow rate | 20 SCCM |
| Gas pressure | 0.13 Pa |
| Source Power (P$_H$) | 2500 W (13.56 MHz) |
| RF bias power | 100 W (2 MHz) |
| Wafer stage temperature | 20° C. |

In this process, W film 65, TiN film 63 and Ti film 62 which are to be primarily etched in a mode close to ion sputtering were rapidly etched by ions abundantly existing in helicon wave plasma $P_H$. In addition, since quantity of radicals produced is small, no under cut took place in W film 65 at the time of over etching.

Figure 5C:
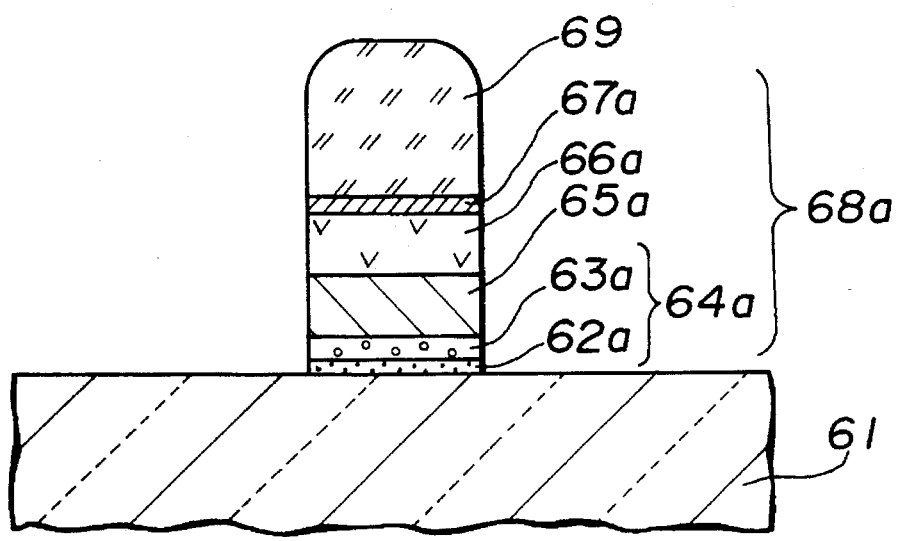
FIG. 5C is a cross sectional view showing, in a model form, the state where W film and barrier metal of FIG. 5B are etched.

As a result, ultimately, Al system wiring pattern 66a having satisfactory anisotropic shape was obtained as shown in FIG. 5C.

While this invention has been explained in accordance with the above-mentioned three embodiments, this invention is not limited to these embodiments in any sense.

While, for example, 13.56 MHz is used as both frequency for helicon wave plasma production and that of ICP production in the above-described embodiments, different frequencies may be used in the both. In this case, phase shifter is not particularly required. Moreover, in the case of helicon wave plasma, since it is possible to accelerate electrons of a specific kind by applied frequency, it is also possible to select optimum frequency in dependency upon the objective process.

In addition, it is needless to say that the configuration of dry etching apparatus, the configuration of sample wafer and the particulars of the dry etching condition may be suitably changed.

As is clear from the foregoing description, when this invention is applied, it becomes possible to conduct control of ion/radical production ratio which was difficult with the conventional helicon plasma. Thus, it becomes possible to carry out higher accuracy plasma processing. For example, in the case where this invention is applied to dry etching, satisfactory high speed anisotropic processing can be carried out while allowing ion assist mechanism to effectively function.

Accordingly, this invention greatly contributes to realization of high integrated and high reliability semiconductor devices through high accuracy of plasma processing.

What is claimed is:

1. A plasma processing apparatus comprising:

a vacuum vessel for containing a wafer;

a helicon wave plasma producing section having a plasma production chamber circumferentially surrounded by a first high frequency antenna and magnetic field producing means and connected to the vacuum vessel, and adapted for supplying helicon wave plasma into the vacuum vessel;

an inductively coupled plasma producing section having a second high frequency antenna which circumferentially surrounds the vacuum vessel, and adapted for producing inductively coupled plasma within the vacuum vessel; and control means for controlling operations of the helicon wave plasma producing section and the inductively coupled plasma producing section.

2. A plasma processing apparatus as defined in claim 1, wherein the second high frequency antenna is symmetrically wound with axial direction of magnetic field produced by the magnetic field producing means being as a center.

3. A plasma processing apparatus as defined in claim 1, wherein auxiliary magnetic field producing means for converging divergence magnetic field in the vicinity of the position where the wafer is held is circumferentially provided outside the vacuum vessel.

4. A plasma processing apparatus as defined in claim 1, wherein the control means includes a switch capable of carrying out simultaneous operation or time series operation of the first and second high frequency antennas.

5. A plasma processing apparatus as defined in claim 1, wherein the control means includes phase control means for allowing phases of high frequency powers of the same frequency respectively applied to the first and second high frequency antennas to be shifted to each other.

6. A plasma processing method wherein the plasma processing apparatus as defined in claim 1, is used to carry out a plasma processing with respect to the wafer contained with the vacuum vessel.

7. A plasma processing method wherein the plasma processing apparatus as defined in claim 1 is used to carry out dry etching of the wafer as the plasma processing while controlling production ratio of chemical species within the vacuum vessel.

8. A plasma processing apparatus as defined in claim 4, wherein the control means includes phase control means for allowing phases of high frequency powers of the same frequency respectively applied to the first and second high frequency antennas to be shifted to each other.

9. A plasma processing method wherein the plasma processing apparatus as defined in claim 5 is used to carry out dry etching of the wafer as the plasma processing while controlling production ratio of chemical species within the vacuum vessel.

10. A plasma processing method wherein the plasma processing apparatus as defined in claim 8 is used to carry out dry etching of the wafer as the plasma processing while controlling production ratio of chemical species within the vacuum vessel.

11. A plasma processing apparatus as defined in claim 1, wherein the control means includes a switch capable of carrying out simultaneous operation and time series operation of the first and second high frequency antennas.

\* \* \* \* \*